US005257049A

United States Patent [19]

Van Peteghem

[11] Patent Number: 5,257,049

[45] Date of Patent: Oct. 26, 1993

[54] LED EXPOSURE HEAD WITH OVERLAPPING ELECTRIC CIRCUITS

[75] Inventor: Willy F. Van Peteghem, Edegem, Belgium

[73] Assignee: Agfa-Gevaert N.V., Mortsel, Belgium

[21] Appl. No.: 723,201

[22] Filed: Jun. 28, 1991

[30] Foreign Application Priority Data

Jul. 3, 1990 [EP] European Pat. Off. ........ 90201779.7

[51] Int. Cl.$^5$ ........................ G01D 15/14; H05K 7/20

[52] U.S. Cl. ........................ 346/107 R; 346/139 R; 361/703; 361/707

[58] Field of Search .......... 346/107 R, 139 R, 76 PH, 346/160, 154; 361/383, 386, 388, 389, 395, 399; 358/298

[56] References Cited

U.S. PATENT DOCUMENTS

| | | | |
|---|---|---|---|
| 4,400,709 | 8/1983 | de Kermodec et al. | 346/154 |
| 4,829,321 | 5/1989 | Iizuka et al. | 346/107 R |
| 4,875,057 | 10/1989 | Hediger et al. | 346/107 R |
| 4,896,168 | 1/1990 | Newman et al. | 346/107 R |
| 4,942,405 | 7/1990 | Dody et al. | 346/107 R |
| 4,951,098 | 8/1990 | Albergo et al. | 346/107 R X |

OTHER PUBLICATIONS

P. F. Heidrich, R. A. Laff, E. G. Lean, and T. B. Light, "LED Array Print Head Configuration", *IBM Technical Disclosure Bulletin*, vol. 25, No. 7A, Dec. 1982, pp. 3368–3370.

*Primary Examiner*—Benjamin R. Fuller
*Assistant Examiner*—David Yockey
*Attorney, Agent, or Firm*—William J. Daniel

[57] ABSTRACT

A light emitting diode exposure head for a recording apparatus which comprises an aligned assembly of a plurality of diode modules, each module including an array of said diodes and associated circuit boards mounted on a common base, the diode modules being supported in elevated position above the base, and interconnection circuit strips for the modules disposed on the base in partial overlapping relation beneath the margins of the elevated modules, the interconnection strips having a line of bonding pads for making wire-bonded connections with the circuit boards.

8 Claims, 4 Drawing Sheets

43
62
45
46
64

33
43
32
28
50

45
46
44
53
51
49
52
54
47
63

LED EXPOSURE HEAD WITH OVERLAPPING ELECTRIC CIRCUITS

BACKGROUND OF THE INVENTION

1. Field of the Invention

The present invention relates to a LED (light-emitting diode) exposure head with overlapping electronic circuits for use in a recording apparatus for linewise recording information on a moving photoreceptor.

2. Description of the Prior Art

A LED exposure head is known that comprises an assembly in alignment of a plurality of LED modules mounted on a common base, and an elongated lens array parallel to the row of LED's. The head is mounted in a housing allowing the mounting of the head in the recording apparatus and also offering protection of the optical and electronic components against environmental conditions.

Each LED module of the head is in fact an assembly of the following on a tiny metal base plate, which functions as a mounting tile.

A row of LED dice with LED's, which lie along the center of the assembly, and are cemented to the front face of the base plate.

On each side of the row of LED dice on each base plate there is a row of several integrated circuit chips which are likewise cemented to the base plate. The chips comprise the drivers for the LED's, a shift register, and occasionally other control circuits.

On the outside of the row of integrated circuit chips on each side of the center line, there is a circuit board cemented to each base plate. The circuit board may be in the form of a printed thick film circuit on a ceramic base, and may comprise trimming resistors, blocking capacitors and probe pads for the testing of the modules, prior to their mounting on the common base.

The modules are mounted in closely adjacent relationship on the base of the exposure head which forms a foundation for the head.

The exposure head finally comprises two elongated interconnection circuit strips that extend at either end of the modules over the length of the exposure head, and that are wire bonded to the circuit boards to bring signals and power to the assembly.

A disadvantage of this known exposure head is its relatively large width, resulting from the location of the different components of the modules beside each other, in the transverse direction of the modules. Yet, a reduced width of the exposure head is desirable, in particular in those instances where two or more colour developments must be performed around a semiconductor drum of a recording apparatus. A development station requires quite some angular space around a semiconductor drum and this space is difficult to reduce.

It is easy to obtain a larger angular space for the different components by using a semiconductor drum of a large diameter, but this adds to the expense and the overall size of the recording apparatus.

SUMMARY OF THE INVENTIOn

Object of the Invention

It is the object of the invention to provide a LED exposure head which is compact, in particular as regards its width, by a suitable geometrical arrangement of its electronic components.

According to the present invention, a LED exposure head for use in a recording apparatus for linewise recording information on a moving photoreceptor, said exposure head comprising an assembly in alignment of a plurality of LED modules mounted on a common base, each module comprising a base plate onto which there are provided a row of LED dice along the center a row of integrated circuit chips disposed laterally of each side of the LED dice, and circuit boards along the opposite side, of such row of integrated circuit chips from said row of LED dice, and wherein elongated interconnection circuit strips extend the length of the exposure head adjacent to the lateral edges of the modules and are electrically connected by wire bonding to the corresponding circuit boards of the modules, is characterized thereby that the base of the exposure head has an elevated central elongated region higher than adjacent relatively depressed regions that the width (a) of the modules is larger than the width (b), of said elevated central region so that the lateral margins of the modules carrying the circuit boards extend in cantilevered fashions beyond the boundaries of said elevated central region, that the elongated interconnection circuit strips are located on the depressed regions of the base, so that the lateral margins of the modules are disposed in overlapping spaced relation to the corresponding interconnection circuit strips, and that the bonding pads of the interconnection circuit strips are located on a line which runs parallel to the length of such strips, just outboard of the corresponding lateral edges of the modules.

The term "recording apparatus" as used in the present specification stands for a xerographic non-impact printer in which an electrostatic charge is applied onto the surface of a moving photoreceptor in the form of a drum or belt and selected areas of the surface are discharged by exposure to light. A developing toner is applied to the surface and adheres to the areas having an electrostatic charge. The toner is then transferred to a sheet of plain paper or the like and heat-fused to form a permanent image. However, the term "recording apparatus" stands also for a copier in which an original image is optically scanned to produce an electronic image signal which then may be controlled for density range, density variation, etc. before it is applied to an exposure head for printing the copy of the original.

The term "photoreceptor" stands for a photoconductive drum, but covers also a member in the form of an endless belt that is conducted along a well-determined path past the exposure head.

The advantage of the more compact size of the exposure head according to the invention results from the overlapping mounting of the circuit boards and the corresponding interconnection circuit strips interconnecting them, whereby a reduction in width of the exposure head of more than 5 mm may be obtained. However, the overlapping relationship of the interconnection circuit strips, and the resulting displacement of the electric connection pads on the strips from the longitudinal edge adjacent to the modules towards a more inward zone of the strips, gives the possibility to locate the longitudinal conductor paths of the strips to the connection pads at both sides of such pads whereby an easier and also a more compact i.e. less wide, layout of the interconnection circuit strips becomes possible, whereby an even larger gain in width of the exposure head can be obtained.

A LED exposure head of the kind as described in the statement of invention is disclosed in WO 90/02387 entitled "Light emitting diode printhead". In this printhead, however, the interconnection of the different modules occurs by the tape automated bonding (TAB) process which employes a web of plastic material provided with conductor wires. Internal module regions of the web have a large number of closely spaced wires that connect the LED chips to the integrated circuit chips whereas external module regions comprise fewer and more widely spaced wires that connect the circuit chips to the interconnection strip.

The TAB process is particularly suited for a fully automated manufacturing process in which the output is nevertheless less than desired. For smaller production series the wire bonding technology is more advantageous since it enables one to make each bond in succession with great precision. The need to making wire bonds between adjacent components lying side-by-side is the reason therefore that such components occupy a relatively large space.

The present invention succeeds in reducing such base area, by providing a raised level for one component, in the present case for the base plate of a module, thereby allowing the mounting of such module in a cantilever position whereby the other component, i.e. the interconnection strip, can be located under the freely extending margin of the module whereby a reduction in space occupied by the modules is obtained.

The invention will be described hereinafter by way of example with reference to the accompanying drawings, wherein.

Figure 1:
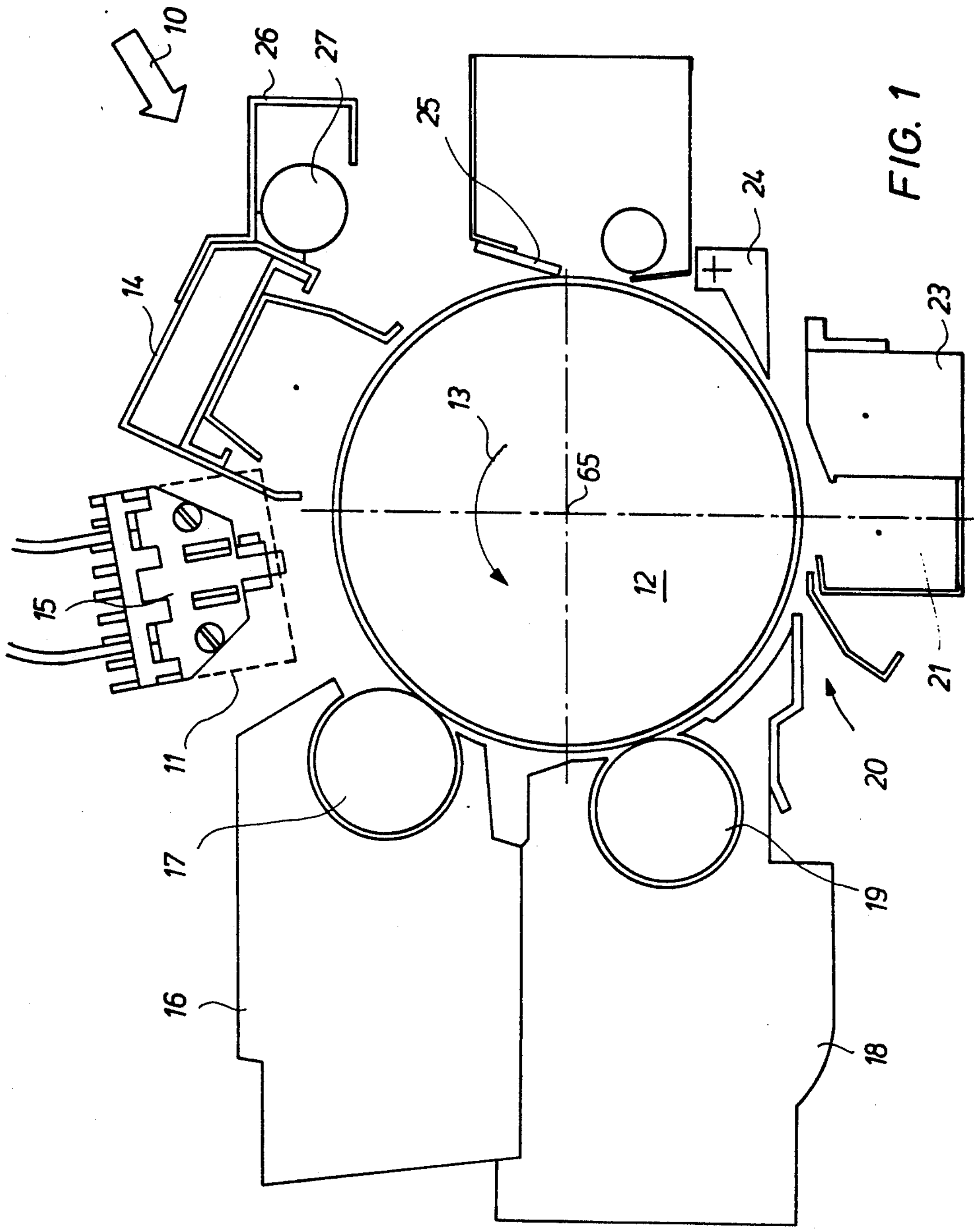
FIG. 1 is a diagrammatic view of the "engine" of a xerographic recording apparatus.

Referring to FIG. 1, the arrow 10 illustrates generally the "engine" of a xerographic printer. The term "engine" denotes the parts of the apparatus that are involved in the production of the image. It is clear that a printer comprises in practice a plurality of other parts such as a paper supply, a toner supply, a fixing station, drive means for rotation of the drum and for the paper transport, a toner fixing station, an electronic control circuit etc. These parts are known in the art and are irrelevant for the understanding of the following description of the present embodiment of the invention.

The engine comprises a photoconductor drum 12 that may be an aluminium cylinder coated with a photosensitive photoconductor, and that is rotatable in the direction of the arrow 13. Around the drum are provided the following stations in angularly spaced relationship.

A corona discharge station 14 to uniformly electrostatically charge the surface of the drum 12.

An exposure head 15 for the line-wise exposure of the charged surface of the photoconductor drum as its surface moves past the head.

A colour developing unit 16 for applying coloured toner to the line-wise discharged drum surface by means of a developer sleeve 17, also called a magnetic brush.

A black developing unit 18 for applying a black toner to the charge pattern on the drum by means of a developer sleeve 19.

A paper feed channel 20 through which a paper sheet is fed into contact with the drum for receipt of the toner image formed on the drum.

A corona transfer station 21 which applies a corona charge of a size opposite to that of the toner to the underside of the paper to attract the toner from the drum onto the paper to form a visible, developed image.

A paper separation station 23 that applies charges to the paper so that it can be easily separated from the drum.

A paper separator 24 which functions to ensure that the paper sheet is reliably separated from the drum.

A cleaning blade 25 for scraping off the residual toner left on the surface of the photoconductor drum after completion of the image transfer. This excess toner may then be conveyed to the toner collecting bottle of the apparatus.

Finally, a main erase 26 which has a lamp 27 for neutralising any residual charge remaining on the surface of the photoconductor drum after cleaning.

In the operation of the engine, the exposure head 15 receives a first image signal to produce on the photoconductor drum 12 a charge pattern that will be developed by the black developing unit 18. The paper sheet that is removed by the separator 24 is passed through a toner fixing station which functions to melt the toner image into the paper sheet. The paper sheet is then returned by an appropriate conveyance mechanism to the feed entry 20 for receiving a second toner image from the photoconductor drum, this time the colour image produced by the station 16 and by appropriate exposure of the head 15. An example of the use of the described two-colour development is a letter or advertising sheet the surface of which bears a conventional black-and-white text, and the heading and/or the bottom of which bear(s) a coloured company logo.

The representation of FIG. 1 shows that the different stations around the photoconductor drum are located in closely spaced relationship. The two developing stations in particular take a considerable part of the angular space around the photoconductor drum. One unit which readily lends itself in practice to a reduction of its angular size without impairing the satisfactory operation of the printer, is the exposure head. The problem of angular space becomes particularly serious in the case of photoconductor drums of a relatively small diameter, that is a diameter smaller than approximately 80 mm.

The present embodiment of the exposure head, which offers a compact unit, is described hereinafter in detail with reference to FIGS. 2 to 5.

The head is mounted within a housing which is composed of a base 28 and a cover 30. The base can be an extrusion-moulded elongated metal section 29 of a light metal alloy, such as aluminium, having a plurality of cooling fins 31 at its outside and four rectangular ribs, viz. two outer 32 and two inner ribs 33 at its inside.

The cover 30 is an assembly of two extrusion-moulded elongated metal sections 34 and 35 of a light metal alloy that are assembled by means of end members 36 and 37. The section 35 is identical to section 34 but has been placed in a reversed position with respect to section 34. The sections 34 and 35 have a beam-like structure with an edge wall 38, a slanting wall 39, an end wall 40, a slot wall 41 and an inner wall 42 that runs parallel with the base, as illustrated for the section 35 in FIG. 3.

The advantage of the tapered configuration of the exposure head is that it requires less angular space around the photoconductor drum than a conventional head with a square cross-section as illustrated in broken lines 11 in FIG. 1.

The two end members 36 and 37 are injection moulded parts that are identical to each other.

More details about the construction features of the exposure head according to the present embodiment may be found in co-pending application 90 201.778.9 filed on the Jul. 3, 1990 and bearing the title: "LED exposure head".

The electronic circuitry of the exposure head is now described with reference to FIGS. 4 and 5, FIG. 4 being a plan view according to the arrow 4 of FIG. 3, and FIG. 5 being an enlarged plan view of one module.

Figure 3:
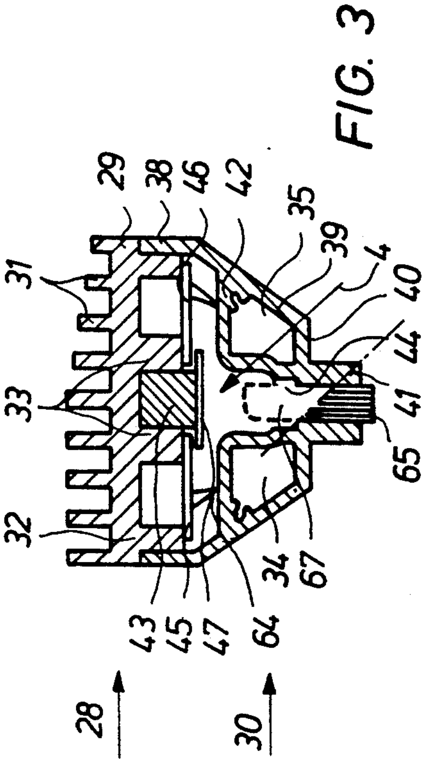
FIG. 3 is a cross-section according to line 3—3 of FIG. 2.
Figures 4A, 4B, 4C:
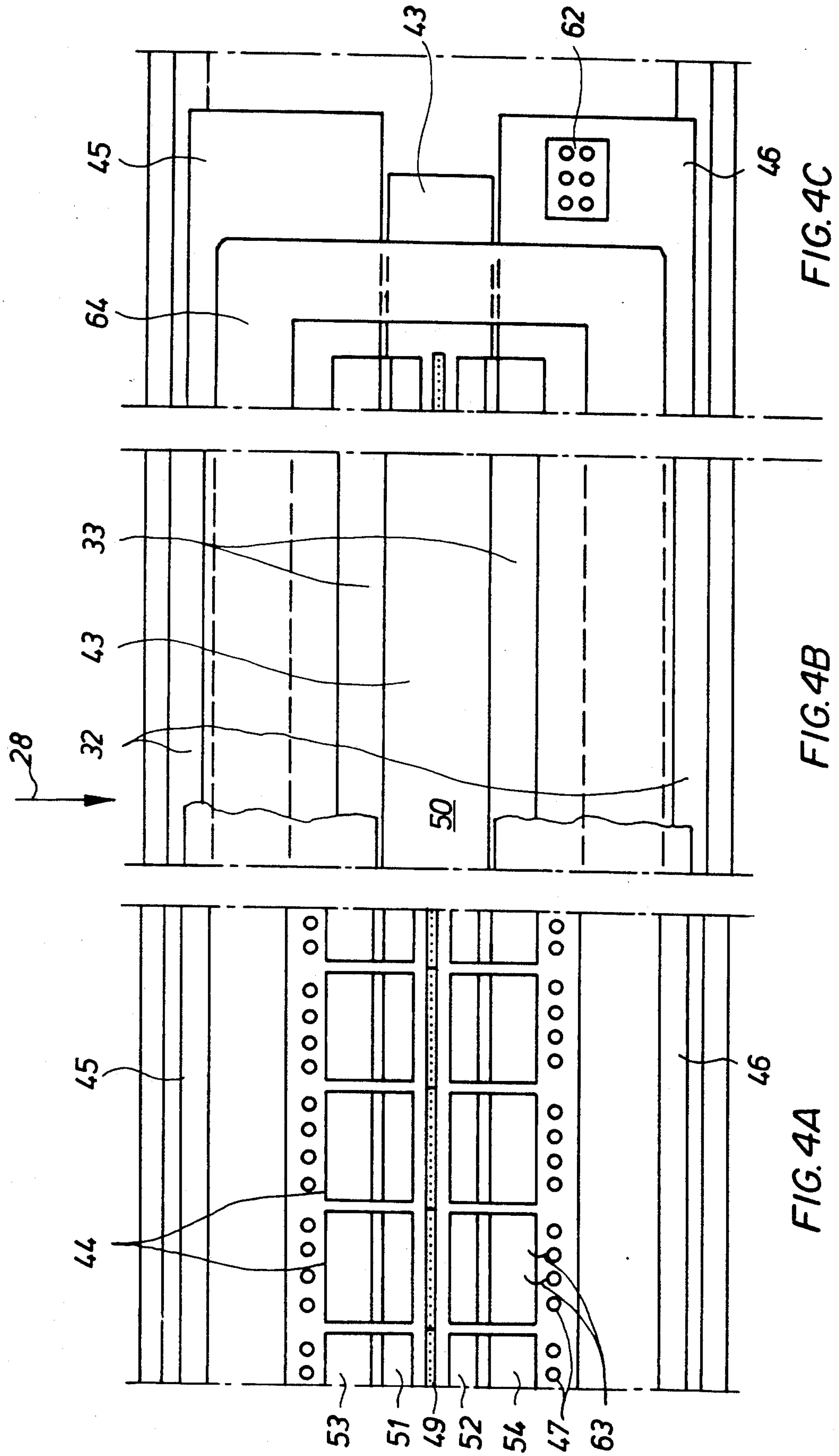
FIG. 4A is a plan view of a central section of the exposure head of the invention, taken substantially in the direction of the arrow 4 in FIG. 3.
FIG. 4B is a plan view similar to FIG. 4A but with the LED modules omitted for clarity.
FIG. 4C is a plan view similar to FIG. 4A but showing an end section of the exposure head.

FIGS. 4A, 4B, and 4C illustrate in fact three sections, section A being a true plan view according to the arrow 4 of FIG. 3, section B showing the base with the LED modules omitted, and section C showing an end section of the exposure head.

The base 28, with its inside facing upwardly, is provided with an elongated copper 43 which is fitted in the channel between the two inner ribs 33 of the base by means of a thermally conductive adhesive that allows minor dimensional changes of the base and of the bar, caused by the heating of these elements during operation of the exposure head. The height of the bar is larger than the height of the ribs 33 so that it protrudes above the mounting surfaces determined by the upper faces of ribs 32 and 33.

Two elongated interconnection circuit strips 45 and 46 are disposed at either side of the bar 43, on the faces of ribs 32 and 33. The thickness of the strips is slightly less than the difference in height between the bar 43 and the ribs 32, 33. The correct position of the strips is obtained via small bores in the strip that fit over corresponding positioning pins upstanding from the base (not illustrated). For the ease of understanding, the strips 45 and 46 have been extended somewhat in the central section B.

Then the different modules 44 are die-bonded in closely spaced side by side relationship to the bar 43 by means of an electrically and thermally conductive adhesive, such as a silver-filled epoxy adhesive.

Figure 5:
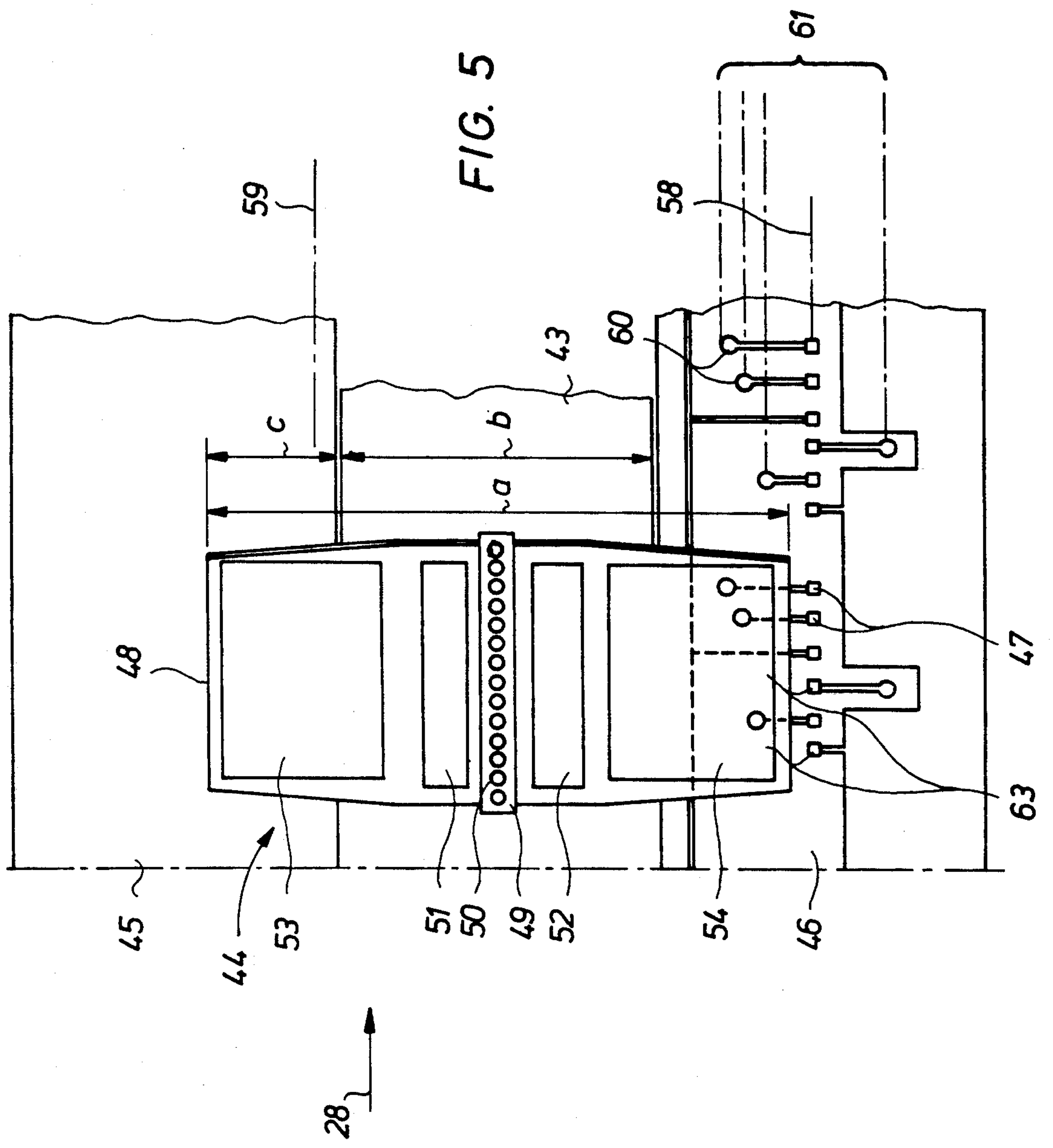
FIG. 5 is an enlarged view of one LED module.

Each module is in fact an assembly of the following on a tiny metal base plate 48, see FIG. 5.

A row of LED dice 49 with LED's 50 lies along the center of the assembly and are cemented to the front face of the base plate by an electrically and thermal by conductive adhesive. Typically, each dice is about eight millimeters long and about one millimeter wide.

On each side of the row of LED dice on each base plate there is a row of several integrated circuit chips 51, and 52, respectively, which are equally cemented in an electrically and thermally conductive way to the base plate. The chips comprise the drivers for the LED's, a shift register, a latch register and occasional further control circuits.

Outboard of the row of integrated circuit chips on each side of the center line, there is a printed circuit board in the form of a conventional thick film circuit on a ceramic base, such as 53 and 54 which is likewise cemented to the base plate. The circuit boards receive were-bonded electric connections such as 63 (only two of which are shown in FIG. 5) from the elongate interconnection circuit strips 45 and 46 at connection pads such as 47, but they also comprise trimming resistors, blocking capacitors, probe pads and other discrete provisions, all as known in the art.

Wire bonded electric connections are also provided between the LED dice 49 and the integrated circuit chips 51 and 52, and between the integrated circuit chips 51 and 52 and the circuit boards 53 and 54. These electrical connections are omitted from the illustration for sake of clarity.

Figure 2:
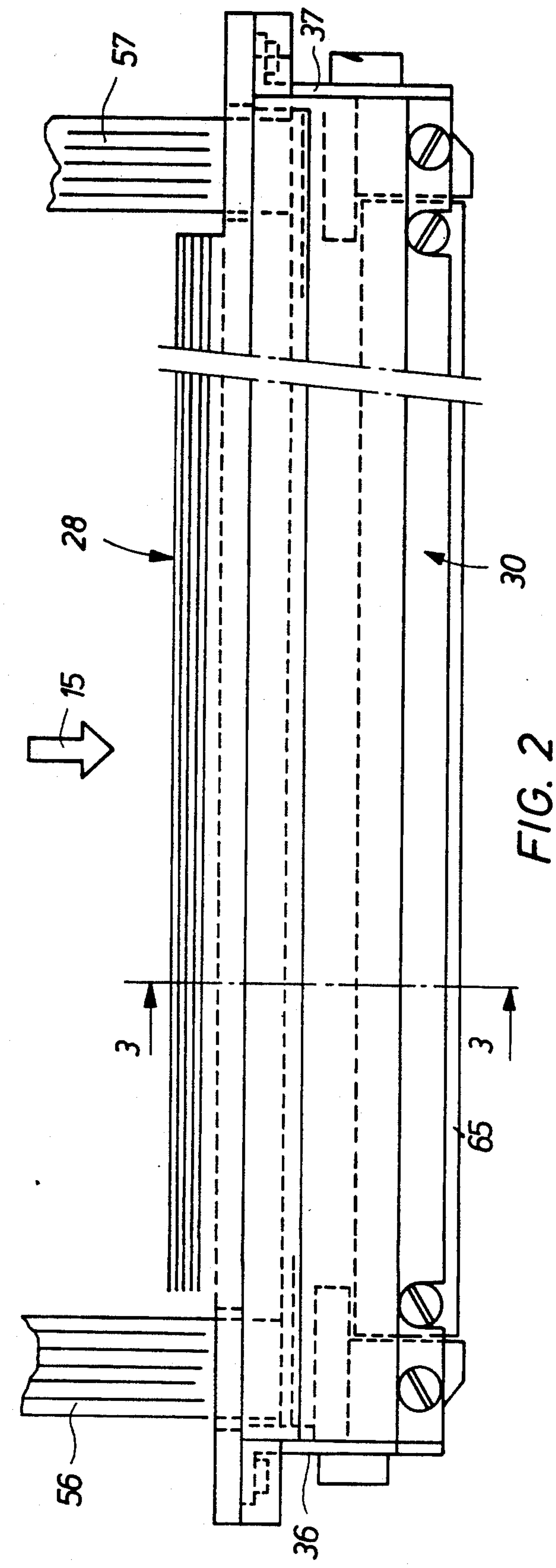
FIG. 2 is a lateral elevation of one embodiment of an exposure head in a xerographic recording apparatus.

The two interconnection circuit strips 45 and 46 have conventional flexible cable connectors such as 56 and 57 at each end, see FIG. 2, so that a total of four connectors leave the base through corresponding elongated openings provided at the ends.

The LED modules 44 have a width a and the width of the bar amounts to b, so that the interconnection circuit strips 45, 46 and the LED-modules 44 overlap each other in vertical spaced relation over a distance c equal to 6.6 mm in the present example (the inner side edge of each circuit strip 45, 46 coincides with the corresponding edge of the bar).

Since this overlap exists on both sides of the modules, it is clear that a reduction in width of more than 2c has been obtained, since in the prior art exposure heads there is an additional clearance space between the adjacent edges of the interconnection circuit strips and of the modules.

A further consequence of the overlapping is that the connection pads 47 on the interconnection circuit strips can be located more towards the interior region of the strips, as indicated by the line 58 in FIG. 5, than at the edge of such strip, as indicated by way of example by the line 59, (see FIG. 5, upper right) as is the case in a conventional head in which the circuit strips lie in the same plane as the circuit boards. This feature has the important advantage that the connector paths on the circuit strips can be disposed on both sides of the connection pads so that the width of the circuit strip itself can also be reduced which leads to a further reduction in width of the exposure head.

Each series of connection pads 47 for each module may comprise six pads, two of them being connected at one side of the line 58 and four of them being connected at the opposite side. The different connections are in connection via metallized bores 60 with conductor paths 61 that lead to end connection areas such as 62 shown in FIG. 4 to which the cable connectors such as 56 and 57 are soldered.

The vertical spacing between the modules 44 and circuit strips 45 and 46 amounts to a few tenths of a millimeter only, so that the bonding by wire bonds such as 63 of the pads 47 of the circuit strips to corresponding pads located at the outer edge of the circuit boards 53 and 54, does not raise any problem.

After the wire bonded electric connections are made between the different electrical components, a preformed generally rectangular resilient sealing bead 64 is adhered to the exposed surface of the printed circuit strips.

Next, a thin protective layer of transparant silicone rubber is applied to the exposed surface of the rectangular sealing bead, thus covering all the electrical components, their wire bondings, etc.

The cover 30 is placed on the base 28 and fastened thereto. The inner walls 42 of the two elongated sections 34 and 35 gently deform the resilient bead 64 whereby a good sealing around the contents between the cover and the base is obtained.

Finally, a lens array 65 is mounted within the slotlike opening 67 of the cover. Correct adjustment of the lens with respect to the LED's may occur by projecting the image of the LED's on a suitable support and enlarging this image by means of a microscope.

The assembled exposure head may be tested for a number of hours at full power, and is then ready for mounting in the printer.

It will be understood that the present invention is not limited to the embodiment described hereinbefore.

The LED modules may be cemented directly onto a suitable central rib of the base, rather than to a separate bar incorporated into said base.

The LED dice 49 and the integrated circuits 51 and 52 may be integrated in one chip.

I claim:

1. In a light emitting diode exposure head for linewise recording information on a photoreceptor in a recording apparatus, in which the head is elongated in length and comprises an assembly of a plurality of generally rectangular-shaped diode modules mounted on a common base in alignment along a common axis extending lengthwise of the head length, each said diode module of said assembly having two opposite side edges located laterally of said axis, each module comprising a substantially rigid generally rectangular base plate, an elongated row of LED dice mounted on a generally centrally-located locus of the base plate extending lengthwise of the head, each said dice row having two opposite sides, a row of integrated circuit chips disposed on said base plate laterally of each side of the LED dice row, each row of said circuit chips having one side adjacent one side of said LED dice row and an opposite side remote from said LED dice row, and a circuit board in common to the integrated circuit chips of each of said rows of integrated circuit chips arranged on said base plate along the remote side of each said row of circuit chips, each circuit board having a side adjacent said remote side of each chip row and an opposite side spaced laterally of said remote side; and wherein an elongated interconnection circuit strip extends over substantially the length of said exposure head adjacent to the laterally spaced opposite side of each of the circuit boards, in combination, the improvement wherein a) said rectangular base plate of each module has two opposite side edges thereof that are parallel to the axis of the LED row of said module and located proximate to the laterally spaced opposite sides of said circuit boards, whereby said circuit boards are supported respectively on opposite side margins of said base plate; b) said common base of the head has an elongated central region defined between opposite side limits that are spaced apart a predetermined distance transversely of the head length, said central region having a generally flat surface lying in a given plane, and side regions on opposite sides of said central region beyond the side limits of the central region, each side region defining a generally flat surface that lies in a plane that is generally parallel to the plane of said central region and spaced therefrom in a direction perpendicular to said plane to define a clearance space between the plane of said central region and the plane of each of said side regions, whereby the flat surface of each side region is depressed relative to the flat surface of the central region; c) said generally rectangularly-shaped modules are mounted on the flat surface of said central region of said base; d) each of said modules has a dimension perpendicular to the length of the head that is sufficiently larger than said predetermined distance between the side limits of said elongated central region of said base that the opposite side margins of each said base plate carrying said circuit boards thereon project in cantilevered fashion beyond said side limits of said elevated central region of the base, e) said elongated interconnection circuit strips are disposed on the depressed flat surfaces of said opposite side regions of the base so that each side margin of each of said module base plates overlaps in spaced relation with a portion of one of said interconnection circuit strips with a clearance space therebetween while another portion of said strip is free of said overlap; f) each of said interconnection circuit strips has bonding pads located on the portion of said circuit strip that is free of said overlap; and g) each of said circuit boards has bonding pads generally adjacent said opposite side margin thereof, said bonding pads of each of said circuit boards being connected by wire-bonding to bonding pads on one of said interconnection strips.

2. A LED exposure head according to claim 1, wherein the circuit boards (53, 54) of the modules comprise resistors and probe pads.

3. The exposure head according to claim 1, wherein said bonding pads of each said interconnection circuit strip which are wire-bonded to said bonding pads of said one of said circuit boards are aligned generally in a line and each of said interconnection strips has electrical conductor paths that lie on both sides of said line of said bonding pads thereon for connection with an electrical supply source.

4. The exposure head of claim 1 wherein the bonding pads on each interconnection circuit strip are arranged in a line extending generally parallel to the head axis.

5. The exposure head of claim 1 wherein said common base is provided on one side with an elongated channel of predetermined depth and includes a separate elongated metal bar seated in said channel, said bar having a planar face thereon exterior of said channel to constitute said flat surface of the central region of said common base and a dimension in a direction perpendicular to said planar face greater than said predetermined depth of said channel whereby said bar projects outside of said channel.

6. The exposure head of claim 5 wherein said common base comprises an elongated metal body of generally rectangular cross-section, said body having on one side thereof a plurality of at least two elongated mounting ribs spaced apart transversely of the length of said ribs and terminating in flat faces lying in a common plane and constituting said side regions on opposite sides of the central region of said common base, said interconnection circuit strips being mounted on said flat faces of said ribs with mutually adjacent edges of said circuit strips in spaced apart relation transversely of the rib length, an adjacent pair of said ribs defining said channel in which said metal bar is seated, said channel being situated between said mutually adjacent edges of said interconnection boards mounted on the rib faces, said modules being mounted on said flat surface of said bar.

7. The exposure head of claim 6 wherein said elongated body is formed of an aluminum alloy.

8. The exposure head of claim 6 wherein said elongated metal body has a second side opposite said one side thereof and said second side is formed with a plurality of elongated cooling ribs.

* * * * *

UNITED STATES PATENT AND TRADEMARK OFFICE

CERTIFICATE OF CORRECTION

PATENT NO. : 5,257,049

DATED : October 26, 1993

INVENTOR(S) : WILLY F. VAN PETEGHEM

It is certified that error appears in the above-indentified patent and that said Letters Patent is hereby corrected as shown below:

Col. 8, line 22, delete "(53,54)".

Col. 8, line 34, change "the head" to --said common--.

Signed and Sealed this

Twenty-ninth Day of March, 1994

Attest:

Bruce Lehman

BRUCE LEHMAN

*Attesting Officer*

*Commissioner of Patents and Trademarks*